(12) United States Patent
Zhang et al.

(10) Patent No.: US 10,224,967 B2
(45) Date of Patent: Mar. 5, 2019

(54) PROTECTING IN-MEMORY IMMUTABLE OBJECTS THROUGH HYBRID HARDWARE/SOFTWARE-BASED MEMORY FAULT TOLERANCE

(71) Applicant: ScaleFlux, San Jose, CA (US)

(72) Inventors: Tong Zhang, Albany, NY (US); Hao Zhong, Los Gatos, CA (US); Fei Sun, Irvine, CA (US); Yang Liu, Milpitas, CA (US)

(73) Assignee: SCALEFLUX, San Jose, CA (US)

( * ) Notice: Subject to any disclaimer, the term of this patent is extended or adjusted under 35 U.S.C. 154(b) by 40 days.

(21) Appl. No.: 15/426,416

(22) Filed: Feb. 7, 2017

(65) Prior Publication Data

US 2017/0228166 A1    Aug. 10, 2017

Related U.S. Application Data

(60) Provisional application No. 62/293,635, filed on Feb. 10, 2016.

(51) Int. Cl.
*H03M 13/00* (2006.01)
*G06F 11/10* (2006.01)
*H03M 13/29* (2006.01)

(52) U.S. Cl.
CPC ..... *H03M 13/6505* (2013.01); *G06F 11/1076* (2013.01); *H03M 13/293* (2013.01); *H03M 13/2909* (2013.01); *H03M 13/2927* (2013.01)

(58) Field of Classification Search
None
See application file for complete search history.

(56) References Cited

U.S. PATENT DOCUMENTS

| | | | | |
|---|---|---|---|---|
| 9,645,847 | B1* | 5/2017 | Roth | G06F 9/45533 |
| 2004/0003337 | A1* | 1/2004 | Cypher | G06F 11/1008 |
| | | | | 714/763 |
| 2004/0162930 | A1* | 8/2004 | Forin | G06F 9/4411 |
| | | | | 711/1 |
| 2007/0180509 | A1* | 8/2007 | Swartz | G06F 9/4406 |
| | | | | 726/9 |
| 2008/0184016 | A1* | 7/2008 | Erlingsson | G06F 12/1441 |
| | | | | 712/233 |
| 2009/0138625 | A1* | 5/2009 | Lee | G06F 9/4812 |
| | | | | 710/23 |
| 2011/0314354 | A1* | 12/2011 | Fillingim | G06F 11/1048 |
| | | | | 714/760 |

* cited by examiner

*Primary Examiner* — Daniel F. McMahon
(74) *Attorney, Agent, or Firm* — Hoffman Warnick LLC

(57) ABSTRACT

A system, method and program product that utilizes a hybrid fault tolerance system for managing data. A system includes: a system for partitioning memory into a set of partitions that includes a designated partition for storing immutable objects; a write system for storing an immutable object in the designated partition, wherein the immutable object is coded with a hardware-based fault tolerance system to generate a set of hardware-based codewords, and wherein the immutable object is further coded with a software-based fault tolerance system to generate a set of software-based codewords; a read system for retrieving the immutable object, wherein the read system decodes each hardware-based codeword for immutable object, and in response to a failed decoding of a hardware-based codeword, the read system decodes the software-based codeword containing a failed hardware-based codeword.

20 Claims, 4 Drawing Sheets

PROTECTING IN-MEMORY IMMUTABLE OBJECTS THROUGH HYBRID HARDWARE/SOFTWARE-BASED MEMORY FAULT TOLERANCE

PRIORITY CLAIM

This application claims priority to U.S. Provisional Patent Application Ser. No. 62/293,635 filed Feb. 10, 2016, which is hereby incorporated herein as though fully set forth.

TECHNICAL FIELD

The present invention relates to the field of computer memory, and particularly to improving cost effectiveness of storing in-memory immutable objects in big data computing systems.

BACKGROUND

Driven by the inevitable trend towards the cloud, more and more real-time in-memory computing applications are being served by large-scale parallel processing platforms (e.g., Spark and Hadoop). To facilitate the development of large-scale in-memory computing applications, most in-memory computing frameworks (e.g., Spark) rely on the use of immutable objects. e.g., Resilient Distributed Datasets (RDD) and DataFrame in Spark. This can obviate a large number of potential problems caused by the updates from multiple threads at once. The use of immutable objects (i.e., data that does not change once written) makes it very safe to share data across processes, and makes it fundamentally easy to gain fault tolerance and correctness.

In current practice, memory controllers (which are typically integrated in the CPU chip) are solely responsible for memory fault tolerance and typically use fine-grained memory error correction. In current mainstream computing systems, memory controllers employ SEC-DED (single error correction, double error detection) coding to protect each 8-bytes of user data with 1-byte coding redundancy, which is primarily for handling DRAM soft errors caused by radiation. As a result, DRAM modules are typically implemented with 72-bit DIMMs to accommodate such ECC configurations. For sub-20 nm DRAM and emerging new memory technologies (e.g., 3D XPoint), such a weak ECC scheme could be inadequate and the memory fault tolerance strength may have to increase at the cost of higher redundancy.

SUMMARY

Accordingly, embodiments of the present disclosure are directed to a system and method for improving the fault tolerance strength for memory partitions storing immutable objects in big data computing systems. The embodiments apply a hybrid fault tolerance scheme in which software-based intra-immutable-object memory error correction is utilized to complement existing hardware-stack memory fault tolerance, which can reduce the effective memory bit cost, especially for big data computing systems.

In a first aspect, the disclosure provides a host system that utilizes a hybrid fault tolerance system for managing data, including: a system for partitioning memory into a set of partitions that includes a designated partition for storing immutable objects; a write system for storing an immutable object in the designated partition, wherein the immutable object is coded with a hardware-based fault tolerance system to generate a set of hardware-based codewords, and wherein the immutable object is further coded with a software-based fault tolerance system to generate a set of software-based codewords; and a read system for retrieving the immutable object, wherein the read system decodes each hardware-based codeword for the immutable object, and in response to a failed decoding of a hardware-based codeword, the read system decodes a software-based codeword containing a failed hardware-based codeword.

In a second aspect, the disclosure provides a method for providing a hybrid fault tolerance scheme for managing data, including: partitioning memory into a set of partitions that includes a designated partition for storing immutable objects; receiving a request to write an immutable object in the designated partition; coding the immutable object with a hardware-based fault tolerance system to generate a set of hardware-based codewords, wherein the hardware-based fault tolerance system processes data for coding along a first dimension; and coding the immutable object with a software-based fault tolerance system to generate a set of software-based codewords, wherein the software-based fault tolerance system processes data for coding along a second dimension, different from the first dimension.

In a third aspect, the invention provides computer program product stored on a computer readable storage medium, which when executed by a computing system, provides a hybrid fault tolerance system for managing data, including: program code for partitioning memory into a set of partitions that includes a designated partition for storing immutable objects; program code for processing a request to store an immutable object in the designated partition, wherein the immutable object is coded with a hardware-based fault tolerance system to generate a set of hardware-based codewords, and wherein the immutable object is further coded with a software-based fault tolerance system to generate a set of software-based codewords; and program code for processing a request to retrieve the immutable object, wherein the processing includes decoding each hardware-based codeword for the immutable object, and in response to a failed decoding of a hardware-based codeword, decoding a software-based codeword containing a failed hardware-based codeword.

BRIEF DESCRIPTION OF THE DRAWINGS

The numerous advantages of the present invention may be better understood by those skilled in the art by reference to the accompanying figures in which.

DETAILED DESCRIPTION

Reference will now be made in detail to the embodiments of the invention, examples of which are illustrated in the accompanying drawings.

Figure 1:
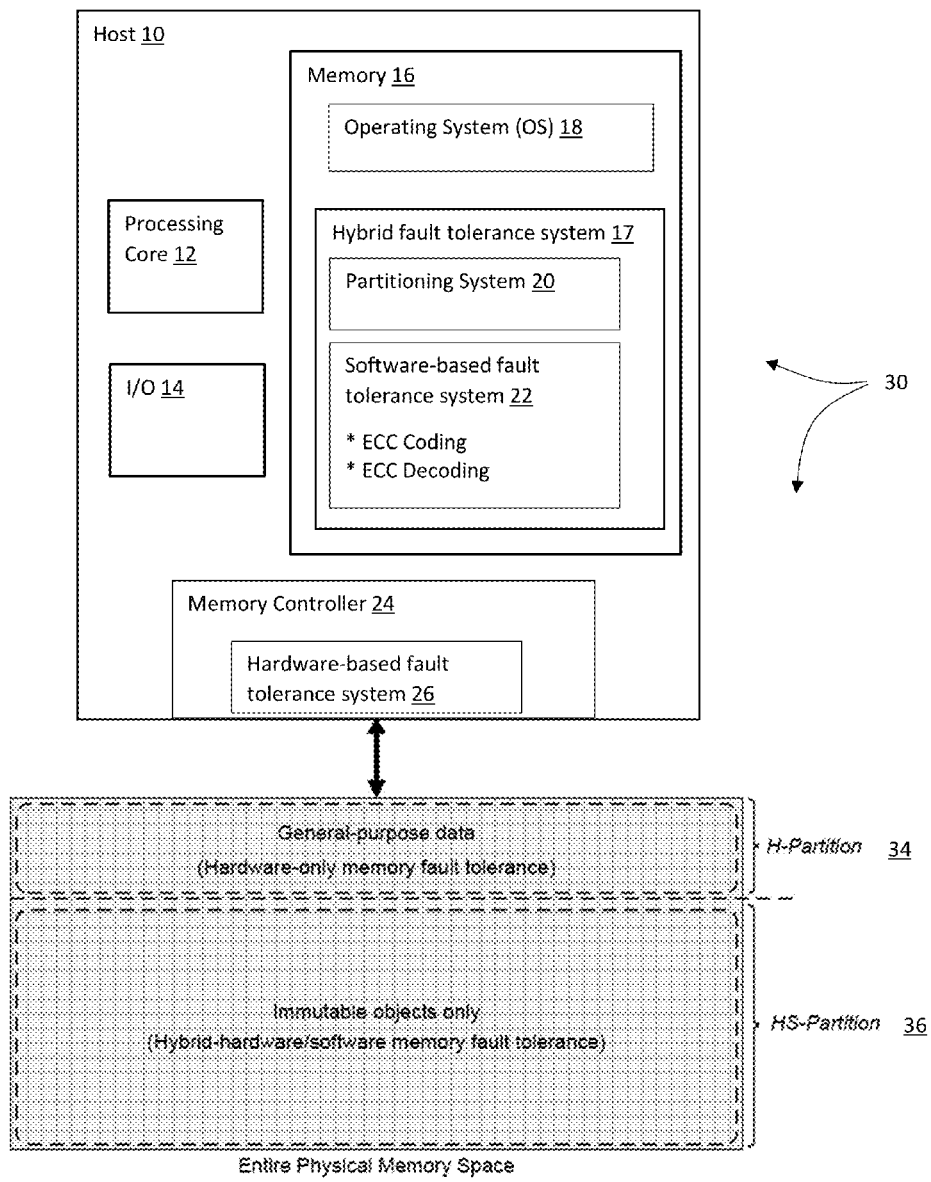
FIG. 1 illustrates a physical memory space partition according to embodiments.

FIG. 1 depicts a memory system 30 for managing memory in a large-scale (big data) computing system using a hybrid fault tolerance system 17. Fault tolerance provides redundant codes that allow data errors (e.g., due to a bad DRAM) in a memory space 32 to be detected and corrected. The illustrative hybrid fault tolerance system 17 is implemented by a host 10 (i.e., server) that provides both: (1) a memory controller 24 that implements a standard hardware-based fault tolerance system 26 and (2) a software-based fault tolerance system 22.

To achieve hybrid fault tolerance, a partitioning system 20 partitions the system's own physical memory space 32 into two regions: (1) an H-partition 34 on which the memory fault tolerance is realized by the memory controller 24 only (e.g., the memory fault tolerance is realized solely in the hardware stack); and (2) an HS-partition 36 on which the memory fault tolerance is realized cohesively by a hardware-based fault tolerance system 26 in the memory controller 24 and the software-based fault tolerance system 22. While the H-partition 34 can be used to store any data, the HS-partition 36 only stores in-memory immutable objects. Each in-memory immutable object is written to memory only once, and does not get updated or altered. Under large-scale in-memory computing frameworks such as Spark, the in-memory immutable objects (e.g., RDD and DataFrame in Spark) tend to dominate the overall memory usage. Hence the capacity of HS-partition 36 tends to be very significant. As shown in FIG. 1, hybrid fault tolerance system 17 is realized by the host 10, which can work together with the hardware-based fault tolerance system 26 in memory controller 24 to improve the overall fault tolerance strength for immutable objects being stored in the HS-partition 36.

Figure 2:
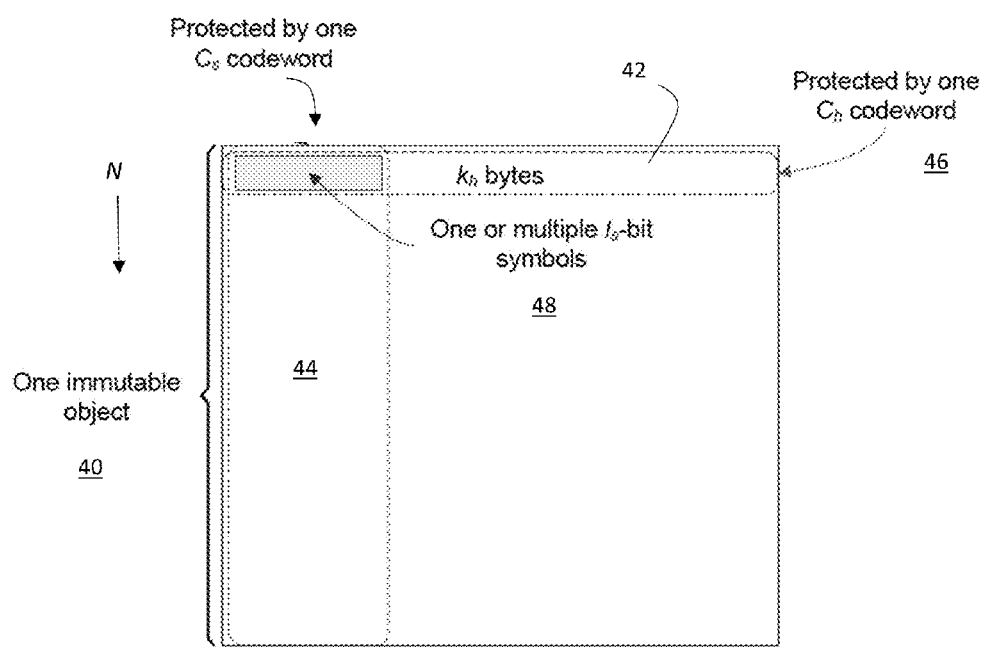
FIG. 2 illustrates the protection of one immutable object according to embodiments.

FIG. 2 shows an illustrative hybrid fault tolerance scheme for the HS-partition 36 realized using error correction coding (ECC). As detailed herein, the protection scheme generates both a set of hardware based codewords 46 and software based codewords 44 when data is written to memory. The diagram of FIG. 2 shows a scheme for generating both types of codewords 44, 46. Note that the codewords 44, 46 are shown overlaid onto the object 40 for illustrative purposes, but it is understood that codewords would be stored separately. In this example, an immutable object 40 is shown that is made up an array of $k_h$ bytes by N rows of user data. Note that only the first row 42 is shown, however each subsequent row is likewise protected using ECC by the hardware-based fault tolerance system 26 (FIG. 1) to generate an associated $C_h$ codeword 46, such that each $C_h$ codeword 46 protects a row (i.e., $k_h$ bytes) of user data. Each $C_h$ codeword 46 includes a series of symbols (with leftmost symbol 48 being shown). Accordingly, each in-memory immutable object 40 is always protected by an integer (i.e., N) number of $C_h$ codewords.

To enhance the memory fault tolerance for the HS-partition 36, each in-memory immutable object 40 is further protected by a set of software based codewords 44, where each $C_s$ codeword 44 protects $k_s$ bytes of user data, in which $k_s \gg k_h$ (hence the $C_s$ codeword can have a much stronger error correction strength than a Ch codeword). As noted, the encoding and decoding of the $C_s$ codewords are implemented by the host 10 in the software stack (i.e., memory 16) by software-based fault tolerance system 22 (FIG. 1). Each $C_s$ codeword 44 protects a vertical slice or column of the immutable object 40, with FIG. 2 highlighting the leftmost column. Thus, the object 40 is protected by processing data along two dimensions, in this case, rows (hardware) and columns (software).

The width of each $C_s$ codeword 44 may for example comprise one or more $l_s$-bit symbols 48 where $l_s$ is an integer number of bits. Using this approach, each $C_s$ codeword 44 and each $C_h$ codeword 46 share a codeword portion, i.e., one or more $l_s$-bit symbols 48.

In one example, assume object 40 is arranged such that each row contains 256 bytes and there are 512 rows, thus forming an array of 512×256-bytes. As noted, each row of 256 bytes is protected by one $C_h$ codeword 46. Furthermore, assume that each $l_s$-bit symbol comprises 8-bits, then each $C_s$ codeword 44 protect a total of 512×8-bits (i.e., one column of data), where one 8-bit symbol 48 is taken from each of the rows. Because each column is 8-bits wide (i.e., 1 byte), a total of 256 $C_s$ codewords would be generated, one for each column. Note that while in this example, the vertical dimension of the $C_s$ codeword 44 corresponds to the number of rows N in the object 40, the two need not necessarily align. Thus, a first set of rows may be coded into a first set of $C_s$ codewords, and a subsequent set of rows may be coded into a second set of $C_s$ codewords. Also note that while this illustrative embodiment codes hardware row by row and codes software column by column, it is understood that they could be reversed or reoriented in any manner, so long as they are captured along different dimensions.

Figure 3:
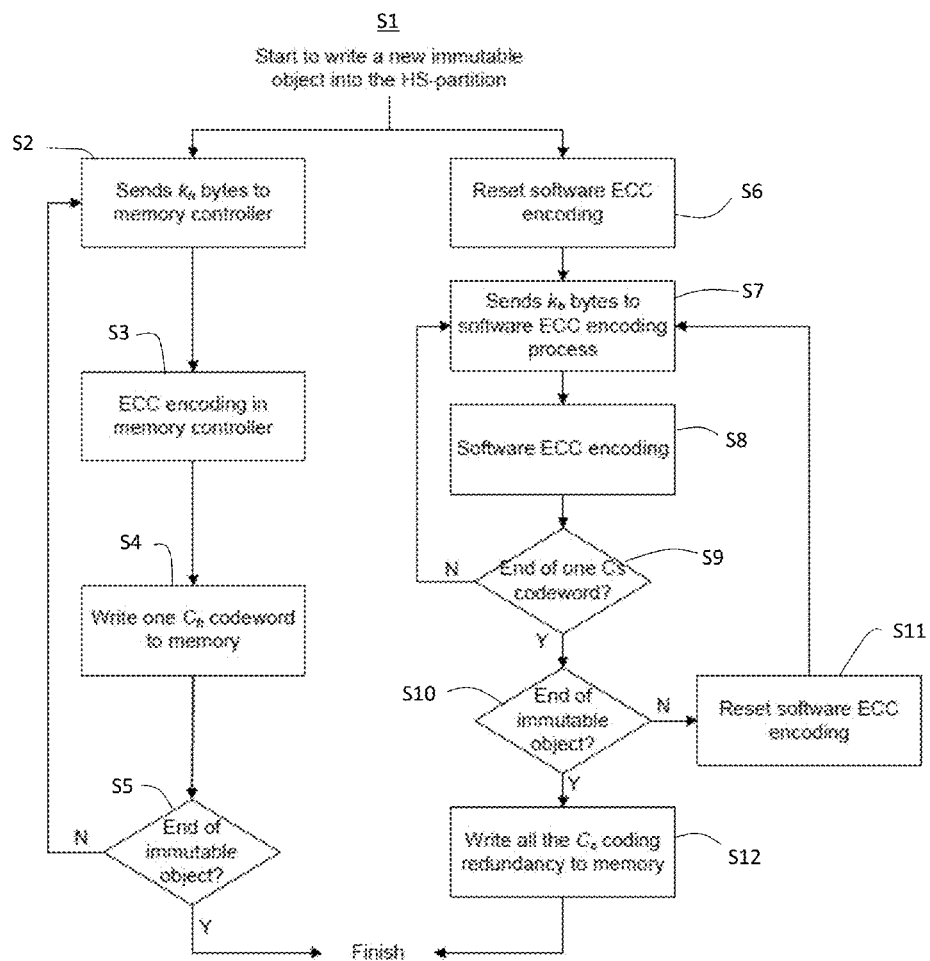
FIG. 3 illustrates a flow diagram of writing an immutable object to an HS-partition according to embodiments.

FIG. 3 shows a write flow diagram for writing data into the HS-partition 36 using the hybrid fault tolerance system 17. The process begins at S1 with the OS 18 of the host 10 requesting a write of an in-memory immutable object to the memory HS-partition 36.

On the left-hand side of the diagram, the host 10 sends $k_h$ bytes (e.g., a row) of data to the memory controller 24 at S2, which gets encoded with ECC encoding by the hardware-based fault tolerance system 26 at S3. At S4, the resulting $C_h$ codeword is written to memory, and a check is made at S5 to determine if the object has been fully processed. If no, control is sent back to S2 where the process repeats for the next $k_h$ bytes. If yes, the hardware encoding finishes.

On the right-hand side, software-based ECC encoding is performed by the software-based fault tolerance system 22. Initially at S6, software encoding is reset and the host 10 sends $k_h$ bytes (e.g., a row) of data to the software ECC encoding process at S7 for encoding at S8. At S9, a determination is made whether all of the rows required to capture a complete set of $C_s$ codewords have been processed, and if not, the process loops back to S7, where another row of $k_h$ bytes of data are encoded at S8. If yes at S9, then a determination is made whether the end of the immutable object has been reached at S10. If no, the software ECC encoding is reset at S11 and the process loops back to S7 where a next set of rows corresponding to an adjacent $C_s$ codeword are processed. If yes at S10, then all of $C_s$ coding redundancy is written to the memory. Accordingly, once all the data and associated hardware based ECC coding in one in-memory immutable object have been written to the memory 32, the host-based $C_s$ software encoding process will write the corresponding $C_s$ coding redundancy to memory as well.

Figure 4:
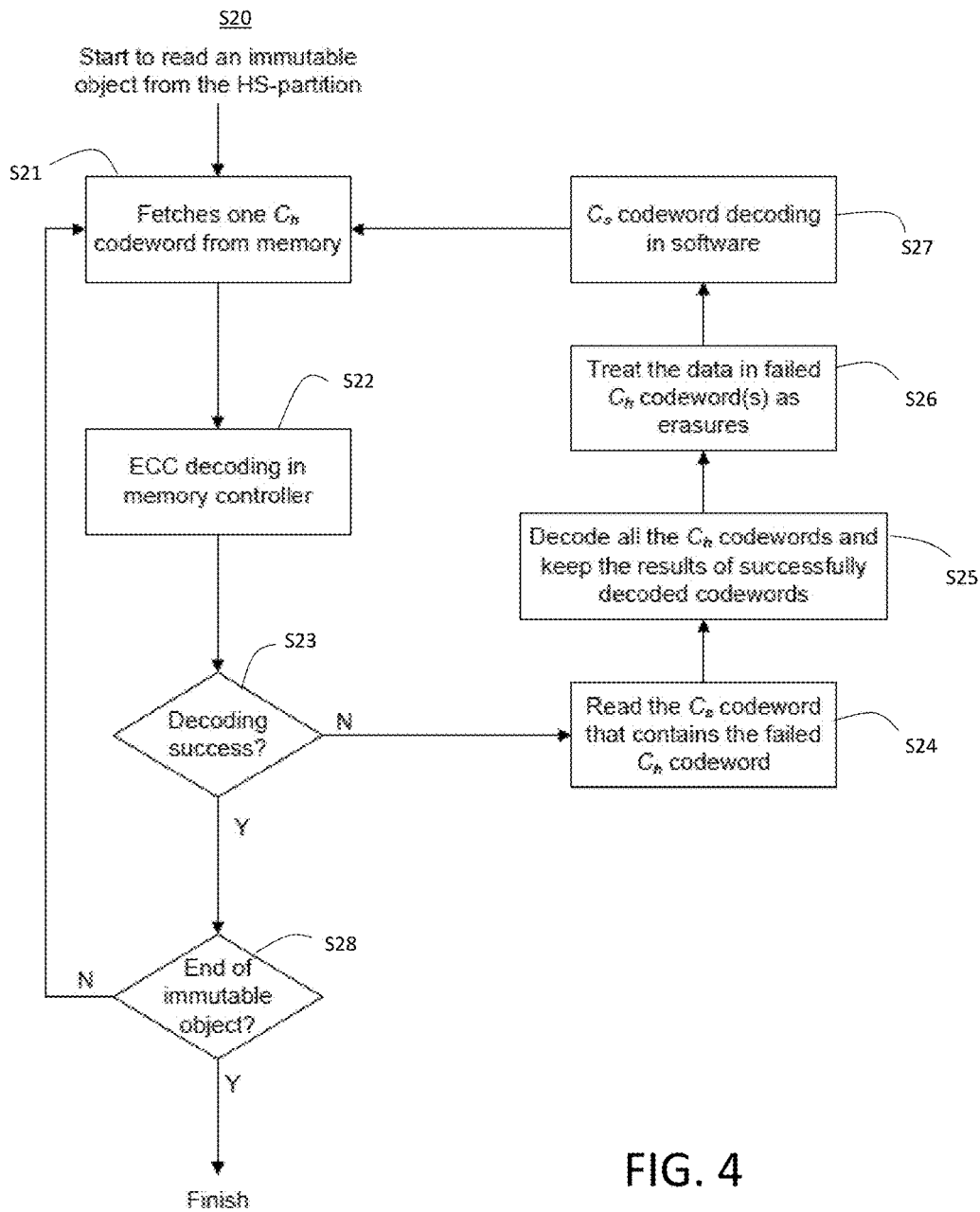
FIG. 4 illustrates a flow diagram of reading an immutable object from an HS-partition.

FIG. 4 shows a flow diagram for reading data using the hybrid fault tolerance system 17 from HS-partition 36. Initially, host 10 receives a request to read an in-memory immutable object from the memory at S20. At S21, the memory controller 24 fetches a $C_h$ codeword from memory and performs ECC decoding using the hardware-based fault tolerance system 26 in memory controller 24 (i.e., the hardware stack) at S22. At S23, a determination is made whether decoding was successful, and if yes, the process loops at S28 until the end of the object is reached. If no at S23, i.e., a $C_h$ decoding failure results, the software based $C_s$ decoding process will be invoked in the software stack to recover the original user data.

Namely, at S24, the $C_s$ codewords that contains the failed $C_h$ codeword are read and decoded at S25 and the results of all successfully decoded $C_h$ codewords are kept. Next, at S26, the data in the failed $C_h$ codeword(s) are treat as erasures and at S27 the $C_s$ codeword is decoded in software by the software-based fault tolerance system 22. The $C_s$ decoding can be used to correct all the erasures. The process then loops to S21 and repeats until the end of the immutable object is reached.

Utilizing this hybrid hardware/software based memory error correction for each in-memory immutable object, the $C_h$ decoding in the hardware stack does not need to guarantee an extremely low decoding failure probability (e.g., $10^{-20}$ and below) as in current practice. Instead, the described system can be exploited to tolerate a much lower raw memory device reliability and/or consume a lesser amount of memory fault tolerance redundancy.

It is understood that the hybrid fault tolerance system 17 may be implemented in any manner, e.g., on a server that includes an integrated circuit board, a processing core 12, I/O 14 and memory 16. Software-based fault tolerance system 22 may be implemented in software or a combination of hardware and software. For example, some of the aspects of the processing logic may be implemented as a computer program product stored on a computer readable storage medium. The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Python, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Furthermore, it is understood that the software-based fault processing system 22 or relevant components thereof (such as an API component, agents, etc.) may also be automatically or semi-automatically deployed into a computer system by sending the components to a central server or a group of central servers. The components are then downloaded into a target computer that will execute the components. The components are then either detached to a directory or loaded into a directory that executes a program that detaches the components into a directory. Another alternative is to send the components directly to a directory on a client computer hard drive. When there are proxy servers, the process will select the proxy server code, determine on which computers to place the proxy servers' code, transmit the proxy server code, then install the proxy server code on the proxy computer. The components will be transmitted to the proxy server and then it will be stored on the proxy server.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A memory system that utilizes a hybrid fault tolerance system for managing data, comprising:
    a system for partitioning memory into a set of partitions that includes a designated partition for storing immutable objects;
    a write system for storing data as an immutable object in the designated partition, wherein the immutable object is coded with a hardware-based fault tolerance system to generate a set of hardware-based codewords in which each hardware-based codeword includes a row of data and generated redundancy codes for the row, and wherein the immutable object is further coded with a software-based fault tolerance system to generate a set of software-based codewords in which each software-based codeword includes a column of and generated redundancy codes for the column; and
    a read system for retrieving the immutable object, wherein the read system decodes each hardware-based codeword for the immutable object, and in response to a failed decoding of a hardware-based codeword, the read system decodes the set of software-based codewords for the immutable object.

2. The memory system of claim 1, wherein each column of data is a predetermined number of bits wide.

3. The memory system of claim 2, wherein a portion of each hardware-based codeword is shared with one of the software-based codewords.

4. The memory system of claim 1, wherein both the hardware-based fault tolerance system and the software-based fault tolerance system utilize error correction coding (ECC).

5. The memory system of claim 1, wherein the hardware-based fault tolerance system is implemented by memory controller.

6. The memory system of claim 1, wherein the software-based fault tolerance system is implemented by a computer program stored in memory of the host system.

7. The memory system of claim 1, wherein a failed hardware-based codeword is treated as an erasure.

8. A method for providing a hybrid fault tolerance scheme for managing data, comprising:
    partitioning memory into a set of partitions that includes a designated partition for storing immutable objects;
    receiving a request to write an immutable object in the designated partition;
    coding the immutable object with a hardware-based fault tolerance system to generate a set of hardware based codewords, wherein the hardware-based fault tolerance system codes data along a first dimension of the immutable object; and
    coding the immutable object with a software-based fault tolerance system to generate a set of software-based codewords, wherein the software-based fault tolerance system codes data along a second dimension of the immutable object, different from the first dimension.

9. The method of claim 8, further comprising:
    receiving a request to write an immutable object in the designated partition;
    retrieving the immutable object and decoding each hardware-based codeword for the immutable object; and
    in response to a failed decoding of a hardware-based codeword, decoding software-based codewords containing a failed hardware-based codeword.

10. The method of claim 8, wherein a portion of each hardware-based codeword is shared with one of the software-based codewords.

11. The method of claim 8, wherein both the hardware-based fault tolerance system and the software-based fault tolerance system utilize error correction coding (ECC).

12. The method of claim 8, wherein the hardware-based fault tolerance system is implemented by a memory controller.

13. The method of claim 8, wherein the software-based fault tolerance system is implemented by a computer program stored in memory of the host system.

14. The method of claim 8, wherein a failed hardware-based codeword is treat as an erasure.

15. A non-transitory computer program product stored on a computer readable storage medium, which when executed by a computing system, provides a hybrid fault tolerance system for managing data, comprising:
    program code for partitioning memory into a set of partitions that includes a designated partition for storing immutable objects;
    program code for processing a request to store an immutable object in the designated partition, wherein the immutable object is coded with a hardware-based fault tolerance system to generate a set of hardware-based codewords in which each hardware-based codeword includes a row of data and generated redundancy codes for the row, and wherein processing of the request to store codes the immutable object with a software-based fault tolerance system to generate a set of software-based codewords in which each software-based codeword includes a column of the data and generated redundancy codes for the column; and
    program code for processing a request to retrieve the immutable object, wherein the processing of the request to retrieve includes decoding each hardware-based codeword for the immutable object, and in response to a failed decoding of a hardware-based codeword, decoding the set of software-based codewords for the immutable object.

16. The computer program product of claim 15, wherein each column of data is a predetermined number of bits wide.

17. The computer program product of claim 16, wherein a portion of each hardware-based codeword is shared with one of the software-based codewords.

18. The computer program product of claim 15, wherein both the hardware-based fault tolerance system and the software-based fault tolerance system utilize error correction coding (ECC).

19. The computer program product of claim 15, wherein the hardware-based fault tolerance system is implemented by a memory controller.

20. The computer program product of claim 15, wherein the software-based fault tolerance system is implemented by a computer program.

* * * * *